United States Patent
Dick et al.

(10) Patent No.: US 12,386,258 B2
(45) Date of Patent: *Aug. 12, 2025

(54) CHAIN EXTENDERS AND FORMULATIONS THEREOF FOR IMPROVING ELONGATION IN PHOTOSENSITIVE POLYIMIDE

(71) Applicant: Hutchinson Technology Incorporated, Hutchinson, MN (US)

(72) Inventors: Andrew R. Dick, Eau Claire, WI (US); Jeffery D. Weckwerth, Dassel, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 680 days.

This patent is subject to a terminal disclaimer.

(21) Appl. No.: 17/712,933

(22) Filed: Apr. 4, 2022

(65) Prior Publication Data

US 2022/0221791 A1 Jul. 14, 2022

Related U.S. Application Data

(63) Continuation of application No. 16/746,695, filed on Jan. 17, 2020, now Pat. No. 11,294,281.

(60) Provisional application No. 62/868,761, filed on Jun. 28, 2019.

(51) Int. Cl.
*G03F 7/037* (2006.01)
*C08G 73/10* (2006.01)
*G03F 7/038* (2006.01)

(52) U.S. Cl.
CPC ......... *G03F 7/037* (2013.01); *C08G 73/1007* (2013.01); *G03F 7/0387* (2013.01)

(58) Field of Classification Search
CPC .............................. G03F 7/0387; G03F 7/037
See application file for complete search history.

(56) References Cited

U.S. PATENT DOCUMENTS

| | | | |
|---|---|---|---|
| RE30,186 | E | 1/1980 | Rubner et al. |
| 4,243,743 | A | 1/1981 | Hiramoto et al. |
| 4,558,117 | A | 12/1985 | Nakano et al. |
| 5,241,041 | A | 8/1993 | Choi et al. |
| 5,382,637 | A | 1/1995 | Angelopoulos et al. |
| 5,858,518 | A | 1/1999 | Omote et al. |
| 6,160,081 | A * | 12/2000 | Tanaka .................... G03F 7/037 |
| | | | 528/229 |

(Continued)

FOREIGN PATENT DOCUMENTS

| | | |
|---|---|---|
| CN | 101578320 A | 11/2009 |
| CN | 106189226 A | 12/2016 |

(Continued)

OTHER PUBLICATIONS

Notice of Reasons of Refusal in Japanese Patent Application No. 2020-110220, mailed May 21, 2024.

(Continued)

*Primary Examiner* — John S. Chu
(74) *Attorney, Agent, or Firm* — DLA Piper LLP (US)

(57) ABSTRACT

Photosensitive polymer formulations, materials and uses of such materials are disclosed. Embodiments of the present disclosure provide photosensitive polyimide materials having chain extenders and formulations thereof that improve elongation and formability of the polyimide materials, and methods of making such polymer materials.

19 Claims, 1 Drawing Sheet

(56) References Cited

U.S. PATENT DOCUMENTS

| | | | |
|---|---|---|---|
| 7,638,259 | B2 | 12/2009 | Goto et al. |
| 7,642,018 | B2 | 1/2010 | Kawasaki et al. |
| 8,304,160 | B2 | 11/2012 | Minegishi et al. |
| 8,614,051 | B2 | 12/2013 | Minegishi et al. |
| 11,294,281 | B2 | 4/2022 | Dick et al. |
| 2006/0210819 | A1 | 9/2006 | Dueber |
| 2007/0218400 | A1 | 9/2007 | Kawasaki et al. |

FOREIGN PATENT DOCUMENTS

| | | | |
|---|---|---|---|
| CN | 109181622 A | 1/2019 | |
| EP | 0 531 019 A1 | 3/1993 | |
| JP | 4-82882 A | 3/1992 | |
| JP | 5-247211 A | 9/1993 | |
| JP | 6-298934 A | 10/1994 | |
| JP | 7-179604 A | 7/1995 | |
| JP | 2000-34556 A | 2/2000 | |
| JP | 2001-254014 A | 9/2001 | |
| JP | 2003-183496 A | 7/2003 | |
| JP | 2003-330167 A | 11/2003 | |
| JP | 2004-240035 A | 8/2004 | |
| JP | 2005-10360 A | 1/2005 | |
| JP | 2006-259700 A | 9/2006 | |
| JP | 2007-286603 A | 11/2007 | |
| JP | 2008-214412 A | 9/2008 | |
| JP | 2010-150333 A | 7/2010 | |
| JP | 5982320 B2 | 8/2016 | |
| WO | 2016/032299 A1 | 3/2016 | |

OTHER PUBLICATIONS

Fukukawa, K., et al., "Recent Progress of Photosensitive Polyimides," Polymer Journal, 2008, vol. 40, No. 4, pp. 281-296.

Yu, P., et al., "Synthesis and characterization of phenylethynyl-terminated polyimide oligomers derived from 2,3,3',4'-diphenyl ether tetracarboxylic acid dianhydride and 3,4'-oxydianiline," Chinese Journal of Polymer Science, Jan. 2016, 34(1), pp. 122-134.

Notice of Granting Patent Right and Search Report in Chinese Patent Application No. 202010596191.8, dated Jun. 15, 2022.

Office Action in U.S. Appl. No. 16/746,695, mailed Aug. 6, 2020.

Office Action in U.S. Appl. No. 16/746,695, mailed Jan. 13, 2021.

Notice of Allowance in U.S. Appl. No. 16/746,695, mailed Nov. 24, 2021.

\* cited by examiner

CHAIN EXTENDERS AND FORMULATIONS THEREOF FOR IMPROVING ELONGATION IN PHOTOSENSITIVE POLYIMIDE

CROSS REFERENCE TO RELATED APPLICATIONS

This application is a continuation of U.S. application Ser. No. 16/746,695, filed Jan. 17, 2020, which claims the benefit of, and priority to, U.S. Provisional Application No. 62/868,761 entitled "Chain Extenders And Formulations Thereof for Improving Elongation in Photosensitive Polyimide" filed Jun. 28, 2019, the entire disclosure of which is hereby incorporated by reference.

TECHNICAL FIELD

Embodiments of the present disclosure relate generally to photosensitive polyimide formulations, materials and uses thereof. More specifically, embodiments of the present disclosure relate to photosensitive polyimide materials having chain extenders and formulations thereof that improve elongation and formability of the polyimide materials, and methods of making.

BACKGROUND

Electronic circuits, such as printed circuit boards and the like are used in a wide range of components, and typically include conductive and insulating layers. For example, in the disk drive industry, flexures are structures that flexibly support a read/write transducer proximate a rotating disk, while also supporting flexible electrical circuitry for conducting electrical signals to and from the transducer. In some structures, a layer of stainless steel is included, sometimes as a base layer, upon which various insulating and conductive layers are formed.

Polymer materials are widely used as insulating layers coated onto metal layers in the manufacture of electronic circuits. To create certain electronic components, the conductive and insulating layers are patterned using photolithography and etching techniques, and thus photosensitive polymer materials are required. Polyimide materials have found use as photosensitive polymer materials in the manufacture of electronic components. Suitable polyimide materials must satisfy many parameters and properties, both during the initial manufacturing processes and later during subsequent processing and use.

In some instances, manufacture of electronic components requires mechanical forming after the devices have been initially processed, and in such instances a cured polymer layer coated on the metal parts is subject to forming. Forming can include bending of the polymer coated metal parts up to an angle of approximately 90 degrees. A small forming radius is particularly desirable as device footprint decreases.

As the device is subjected to forming (e.g., bending of the device), the polymer coating is elongated in the formed area. Forming of the polymer coating poses many challenges. A component or device is generally includes a polymer layer coated on a metal layer, such as stainless steel. When initially manufactured, the metal layer in the device is in a neutral axis state, in which the metal layer is neither in tension nor compression. At this stage, the polymer layer will have been cured. Next, the device is formed or bent which causes the polymer layer to elongate in the formed area. As the radius of the formed area continues to decrease, the polymer elongation continues to increase in the formed area.

If the polymer ultimate strain is exceeded during the forming process, cracks in the polymer layer will occur and the polymer material will fail. This is a significant problem and has severely limited the utility of photosensitive polymer materials in such formed device applications. Common failure modes of polymer layers after forming include complete breaks in the polymer layer and partial breaks in the polymer layers, both in polymer layers formed atop a metal layer and in freestanding polymer layers, respectively. Such complete and partial breaks in the formed polymer layers are catastrophic and can render the devices unusable.

This problem is prevalent across conventional polymer materials. Very low molecular weight polymer formulations tended to crack badly during solvent develop steps. On the other hand, it is known that higher molecular weight polymers exhibit better elongation and formability after forming. However, when photosensitive materials are needed, high molecular weight photosensitive polymers are difficult or impractical to process. By way of example and without limitation, high molecular weight polymers are generally considered to have an average molecular weight in the range of about 40,000 and above. High molecular weight polymers exhibit properties that negatively impact the initial manufacturing steps, and in particular the photolithography processing steps. For example, high molecular weight photosensitive polymers generally exhibit very high viscosity and/or low solids content. Filtration is very time consuming and expensive. Photolithographic contrast and develop speed are poor. Thus, high molecular weight photosensitive polymers are not suitable for the initial processing steps prior to the cure step.

Thus, the problem is highly complicated and presently available polymer materials are substantially unsuitable. According, new developments are greatly needed.

SUMMARY

Broadly, embodiments of the present disclosure provide photosensitive polymer formulations, materials and uses of such materials. More specifically, embodiments of the present disclosure provide photosensitive polyimide materials having latent chain extenders and formulations thereof that improve elongation and formability of the polyimide materials, and methods of making such polymer materials.

The inventors have discovered that a number of complex factors must be understood and balanced with respect to the chemistry and properties of photosensitive polymer formulations throughout processing, including during the initial device manufacturing steps, the manner in which the polymer formulation undergoes the curing step, and the subsequent forming step, in order to solve the aforementioned problems.

As described in more detail below, polymers having lower molecular weights exhibit more desirable characteristics during initial manufacturing steps, in particular photolithography processing steps. While polymers having higher molecular weights exhibit better elongation or formability during subsequent forming step. After substantial study and effort, the inventors have developed an innovative polymer formulation and method of making, wherein the polymer formulation and chemistry is selectively manipulated to control the molecular weight of the polymer to achieve desired properties throughout the manufacturing, curing, and forming steps. For example, in some embodiments a method is provided which selectively controls the molecular weight of a poly(amic acid) in the photosensitive polymer formulation to be in a relatively low weight average molecular weight range during the initial processing steps, and then increases the weight average molecular weight of the polyimide polymer during curing to form a polyimide insulating layer that contains a polyimide polymer having a high weight average molecular weight that exhibits improved elongation and formability during a subsequent forming step. Thus, broadly stated the molecular weight of the polyimide polymer is greater (increased) after curing.

In some embodiments, the weight average molecular weight of the polyimide polymer is increased by at least two times after curing as compared to the weight average molecule weight of the base polymer in the initial polymer formulation before curing. In some embodiments, the weight average molecular weight of the polyimide polymer is increased to about 60,000 after curing. For some embodiments, the weight average molecular weight of the polyimide polymer can be increased to much more than 60,000, e.g., 10,000,000, after curing. While the weight average molecular weight of the cured polymer cannot be readily measured, it can be estimated based on comparison to a known polymer with similar forming behavior.

For some embodiments, a photosensitive polymer formulation can include a poly(amic acid) salt as a polyimide precursor, and a tertiary amine salt of a tetracarboxylic acid as a latent chain extender.

For some embodiments, the poly(amic acid) salt includes (i) a base polymer of a dianhydride and a diamine, and (ii) a crosslinking agent.

For some embodiments, the poly(amic acid) salt is a poly(amic acid) tertiary amine salt.

For some embodiments, the dianhydride is BPDA.

For some embodiments, the diamine 15 TFMB.

For some embodiments, the crosslinking agent is DEEM.

For some embodiments, a weight average molecular weight of the base polymer is about 40,000 and less.

For some embodiments, a weight average molecular weight of the base polymer is about 25,000-35,000.

For some embodiments, the tertiary amine salt of a tetracarboxylic acid as the latent chain extender is prepared by reacting a dianhydride with water and a tertiary amine at room temperature. For some embodiments, the tertiary amine salt of a tetracarboxylic acid as the latent chain extender is prepared by reacting a tetracarboxylic acid with a tertiary amine.

For some embodiments, the latent chain extender is prepared by reacting BPDA with water and DEEM at room temperature to form the tertiary amine salt of a tetracarboxylic acid.

For some embodiments, a mol % of the diamine is higher than the mol % of the dianhydride.

For some embodiments, a mol % of the dianhydride to a mol % of the diamine is in the range of 0.900 to 0.999:1.000.

For some embodiments, a ratio of a mol % of the dianhydride and the latent chain extender to a mol % of the diamine is about 1.000:1.000.

For some embodiments, the photosensitive polymer formulation can further include a photoinitiator.

For some embodiments, the photosensitive polymer formulation can further include a sensitizer.

For some embodiments, the photosensitive polymer formulation can further include a dissolution accelerator.

For some embodiments, the photosensitive polymer formulation can further include a adhesion promoter.

For some embodiments, a method of forming a polyimide polymer is provided that can include: providing the photosensitive polymer formulation of according to some embodiments of the present disclosure; and curing the photosensitive polymer formulation, whereupon the latent chain extender is activated and reforms a dianhydride that reacts with terminal amine groups to form new imide bonds forming the polyimide polymer.

For some embodiments, the poly(amic acid) salt includes (i) a base polymer of a dianhydride and a diamine, and (ii) a crosslinking agent.

For some embodiments, the method can further include controlling a mol % of the diamine to be higher than a mol % of the dianhydride to control a weight average molecular weight of the base polymer of the poly(amic acid) salt in the photosensitive polymer formulation.

For some embodiments, the method can further include controlling a ratio of a mol % of the dianhydride and the latent chain extender to a mol % of the diamine is about 1.000:1.000.

BRIEF DESCRIPTION OF THE DRAWINGS

The accompanying drawings, which are incorporated in and constitute a part of this specification, exemplify various embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not generally drawn to scale.

DETAILED DESCRIPTION

Figure 1:
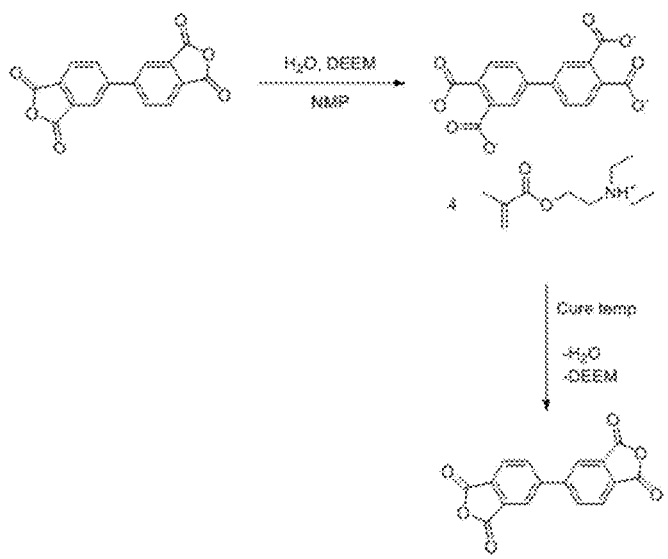
FIG. 1 shows an exemplary reaction of forming the latent chain extender according to some embodiments of the present disclosure.

To solve the problems described in the summary, the inventors have spent substantial effort investigating parameters, characteristics and variables that impact various properties of polymer materials during different manufacturing process steps. For purposes of this description, the manufacturing process steps are broadly defined as: (1) initial device manufacturing steps which include (without limitation) coating an initial polymer formulation on metal layers, and various photolithography steps such as patterned UV exposure and developing; (2) curing of the polymer formulation on the metal layer; and (3) subsequent forming step. Those of skill in the art will recognize that other steps may be employed and in varying order and that the inventions disclosed herein are not limited to such, but that the above definition is provided for convenience and ease of description.

A polymer formulation including a polyimide precursor and a latent chain extender is provided. For some embodiments, the polyimide precursor is a poly(amic acid) salt. Preferably, the polyimide precursor is a poly(amic acid) salt including (i) a polymer of a dianhydride and a diamine, and (ii) a crosslinking agent. For some embodiments, the polyimide precursor is a poly(amic acid) tertiary amine salt. The polyimide precursor can be made from synthesis methods known in the art. For example, the polyimide precursor can be made from a synthesis method in which the dianhydride and diamine are polymerized in an organic solvent to produce a poly(amic acid) solution. Then, a crosslinking agent, such as a tertiary amine, is added to form a poly(amic acid) tertiary amine salt solution, as well as any other additives that are part of the photopackage.

The poly(amic acid), i.e., the polymer of a dianhydride and a diamine, has relatively low weight average molecular weight. By way of example and without limitation, low weight average molecular weight polymers according to the present disclosure are generally considered to have a weight average molecular weight in the range of about 40,000 and less, typically about 25,000-35,000. It should be noted that for the weight average molecular weight numbers disclosed in the present disclosure, the numbers were determined using gel permeation chromatography (GPC) using DMF with LiBr and phosphoric acid as the mobile phase and based on PEO standards. It should also be understood within the scope of the disclosed invention, that for high weight average molecular weight polymers, the molecular weight needed for elongation performance will change with the polymer backbone.

The dianhydride of the polyimide precursor includes may include, but is not limited to, monomers having an anhydride structure. Preferably, the dianhydride includes a tetracarboxylic acid dianhydride structure. The dianhydride component employed may be any suitable dianhydride for forming a crosslinkable or crosslinked polyimide prepolymer, polymer, or copolymer. For example, tetracarboxylic acid dianhydrides, singly or in combination, may be utilized, as desired.

For some embodiments, the dianhydride is an aromatic dianhydride. Illustrative examples of aromatic dianhydrides suitable for use in the polyimide precursor include: 2,2-bis(4-(3,4-dicarboxyphenoxy)phenyl)propane dianhydride; 4,4'-bis(3,4-dicarboxyphenoxy)diphenyl ether dianhydride; 4,4'-bis(3,4-dicarboxyphenoxy)diphenyl sulfide dianhydride; 4,4'-bis(3,4-dicarboxyphenoxy)benzophenone dianhydride; 4,4'-bis(3,4-dicarboxyphenoxy)diphenyl sulfone dianhydride; 2,2-bis(4-(2,3-dicarboxyphenoxy)phenyl)propane dianhydride; 4,4'-bis(2,3-dicarboxyphenoxy)diphenyl ether dianhydride; 4,4'-bis(2,3-dicarboxyphenoxy)diphenyl sulfide dianhydride; 4,4'-bis (2,3-dicarboxyphenoxy)benzophenone dianhydride; 4,4'-bis(2,3-dicarboxyphenoxy)diphenyl sulfone dianhydride; 4-(2,3-dicarboxyphenoxy)-4'-(3,4-dicarboxyphenoxy)diphenyl-2,2-propane dianhydride; 4-(2,3-dicarboxyphenoxy)-4'-(3,4-dicarboxyphenoxy)diphenyl ether dianhydride; 4-(2,3-dicarboxyphenoxy)-4'-(3,4-dicarboxyphenoxy)diphenyl sulfide dianhydride; 4-(2,3-dicarboxyphenoxy)-4'-(3,4-dicarboxyphenoxy) benzophenone dianhydride and 4-(2,3-dicarboxyphenoxy)-4'-(3,4-dicarboxyphenoxy)diphenyl sulfone dianhydride, 1,2,4,5-benzenetatracarboxylic dianhydride as well as mixtures comprising one of the foregoing dianhydrides.

Preferred dianhydrides include the following dianhydride compounds:
3,4,3',4'-biphenyltetracarboxylic dianhydrides (BPDA) having the following formula:

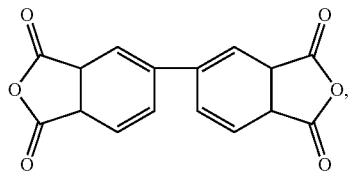 [SMILES: O=C1OC(=O)C2C=C(C3=CC4C(=O)OC(=O)C4C=C3)C=CC12]

3,4,3',4'-benzophenonetetracarboxylic dianhydrides (BTDA) having the following formula:

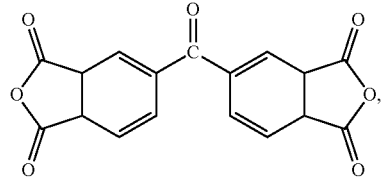 [SMILES: O=C(C1=CC2C(=O)OC(=O)C2C=C1)C1=CC2C(=O)OC(=O)C2C=C1]

2,2-bis(3',4'-dicarboxyphenyl)hexafluoropropane dianhydrides (6FDA) having the following formula:

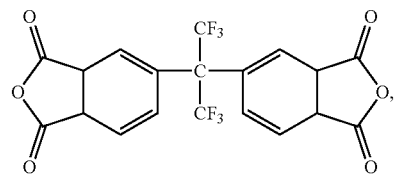 [SMILES: O=C1OC(=O)C2C=C(C(C3=CC4C(=O)OC(=O)C4C=C3)(C(F)(F)F)C(F)(F)F)C=CC12]

pyromellitic dianhydrides (PMDA) having the following formula:

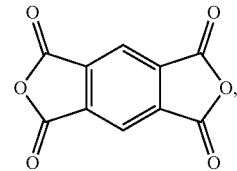 [SMILES: O=c1oc(=O)c2cc3c(=O)oc(=O)c3cc12]

and mixtures thereof.

The diamine is a diamine compound having two amino groups in the molecular structure. Examples of the diamine compound include any aromatic diamine compound or aliphatic diamine compound, with an aromatic diamine compound being preferable.

Examples of the diamine compound include aromatic diamines such as 2,2'-bis(trifluoromethyl)benzidine (TFMB), p-phenylenediamine, m-phenylenediamine, 4,4'-diaminodiphenylmethane, 4,4'-diaminodiphenylethane, 4,4'-diaminodiphenyl ether, 4,4'-diaminodiphenyl sulfide, 4,4-diaminodiphenylsulfone, 1,5-diaminonaphthalene, 3,3-dimethyl-4,4'-diaminobiphenyl, 5-amino-1-(4'-aminophenyl)-1,3,3-trimethylindane, 6-amino-1-(4'-aminophenyl)-1,3,3-trimethylindane, 4,4'-diaminobenzanilide, 3,5-diamino-3'-trifluoromethylbenzanilide, 3,5-diamino-4'-trifluoromethylbenzanilide, 3,4'-diaminodiphenyl ether, 2,7-diaminofluorene, 2,2-bis(4-aminophenyl) hexafluoropropane, 4,4'-methylene-bis(2-chloroaniline), 2,2',5,5'-tetrachloro-4,4'-diaminobiphenyl, 2,2-dichloro-4,4'-diamino-5,5'-dimethoxybiphenyl, 3,3'-dimethoxy-4,4'-diaminobiphenyl, 4,4'-diamino 2,2'-bis(trifluoromethyl)biphenyl, 2,2-bis[4-(4-aminophenoxy)phenyl]propane, 2,2-bis[4-(4-aminophenoxy)phenyl]hexafluoropropane, 1,4-bis(4-aminophenoxy)benzene, 4,4'-bis(4-aminophenoxy)-biphenyl, 1,3'-bis(4-aminophenoxy)benzene, 9,9-bis(4-aminophenyl)fluorene, 4,4'-(p-phenyleneisopropylidene) bisaniline, 4,4'-(m-phenyleneisopropylidene)bisaniline, 2,2'-bis[4-(4-amino-2-trifluoromethylphenoxy)phenyl] hexafluoropropane, and 4,4'-bis[4-(4-amino-2-trifluoromethyl)phenoxy]-octafluorobiphenyl; aromatic diamines having two amino groups bonded to an aromatic ring and hetero atoms other than nitrogen atoms of the amino groups such as diaminotetraphenyl thiophene; and aliphatic and alicyclic diamines such as 1,1-metaxylylenediamine, 1,3-propanediamine, tetramethylenediamine, pentamethylenediamine, octamethylenediamine, nonamethylenediamine, 4,4-diaminoheptamethylenediamine, 1,4-diaminocyclohexane, isophoronediamine, tetrahydrodicyclopentadienylenediamine, hexahydro-4,7-methanoindanylene dimethylenediamine, tricyclo[6,2,1,0$^{2,7}$]-undecylene dimethyldiamine, and 4,4'-methylenebis(cyclohexyl amine).

Among these, an aromatic diamine compound is preferable as the diamine compound. Specifically, for example, 2'-bis(trifluoromethyl)benzidine (TFMB), p-phenylenediamine, m-pheylenediamine, 4,4'-diaminodiphenylmethane, 4,4'-diaminodiphenyl ether, 3,4'-diaminodiphenyl ether, 4,4'-diaminodiphenylsulfide, and 4,4'-diaminodiphenylsulfone are preferable, and 4,4'-diaminodiphenyl ether and p-phenylenediamine are particularly preferable. Most preferably, the diamine compound is TFMB. The diamine compound may be used alone or in combination of two or more kinds thereof.

The crosslinking agent forming the poly(amic acid) salt can be any suitable crosslinking agent known in the art. For some embodiments, the crosslinking agent forming the poly(amic acid) salt is a tertiary amine, thereby forming poly(amic acid) tertiary amine salt as the polyimide precursor. Suitable crosslinking agents for the polymer formulation include, but are not limited to, 2-(diethylamino)ethyl methacrylate (DEEM), 2-(dimethylamino)ethyl methacrylate (DMAEMA), 2-(dimethylamino)ethyl methacrylate (DMEM), 3-(dimethylamino)propyl methacrylate (DMPM), 2-(dimethylamino)ethyl acrylate (DMEA), 2-(diethylamino) ethyl acrylate (DEEA), and 3-(dimethylamino)propyl acrylate (DMPA). Preferably, the crosslinking agent is 2-(diethylamino)ethyl methacrylate (DEEM).

These exemplary tertiary amines include a double bond, which can serve as a crosslinking agent. Other tertiary amines which include double bonds can also be used and can also serve as a crosslinking agent. The tertiary amine can also be an additive or part of an additive that influences other properties of the final resulting polyimide.

The polyimide precursor can be provided in a solvent as discussed above. Any suitable solvent that is known in the art can be used. For some embodiments, the solvent can be an organic solvent, including, but not limited to, N-methyl-2-pyrrolidone (NMP), N,N-dimethylformamide (DMF), N,N-dimethyl acetamide (DMAc), dim ethyl sulfoxide (DMSO), hexanemethylenephosphoramide (HMPA), N-methylcaprolactam, and N-acetyl-2-pyrrolidone.

The polymer formulation further includes a latent chain extender along with the polyimide precursor. For some embodiments, the latent chain extender is a tertiary amine salt of a tetracarboxylic acid. For some embodiments, the latent chain extender can be prepared by reacting a dianhydride of choice with water and a tertiary amine cross-linker at room temperature. The dianhydride used to form the latent chain extender can be a dianhydride as discussed above. For purposes of the present disclosure, room temperature is about 20 to 24° C.

As an illustrative embodiment of the latent chain extender, a dianhydride of choice, such as BPDA, is reacted with water and a tertiary amine cross-linker at room temperature to produce a tertiary amine salt of a tetracarboxylic acid, as shown in the reaction provided in FIG. 1. More specifically, in the exemplary reaction provided in FIG. 1, the tertiary amine salt of a tetracarboxylic acid (chain extender) is prepared by reacting BPDA with water and 2-(diethylamino)ethyl methacrylate (DEEM') in a solvent, such as NMP.

The tertiary amine can be a cross-linker, such as 2-(diethylamino)ethyl methacrylate (DEEM) or 2-(dimethylamino)ethyl methacrylate (DMAEMA). These exemplary tertiary amines include a double bond, which can serve as a cross-linker. Other tertiary amines which include double bonds can also be used and can also serve as a cross-linker. The tertiary amine can also be an additive or part of an additive that influences other properties of the final resulting polyimide.

Any suitable solvent that is known in the art can be used. For some embodiments, the solvent can be an organic solvent, including, but not limited to, N-methyl-2-pyrrolidone (NMP), N,N-dimethylformamide (DMF), N,N-dimethylacetamide (DMAc), dimethylsulfoxide (DMSO), hexanemethylenephosphoramide (HMPA), N-methylcaprolactam, and N-acetyl-2-pyrrolidone.

Figure 2:
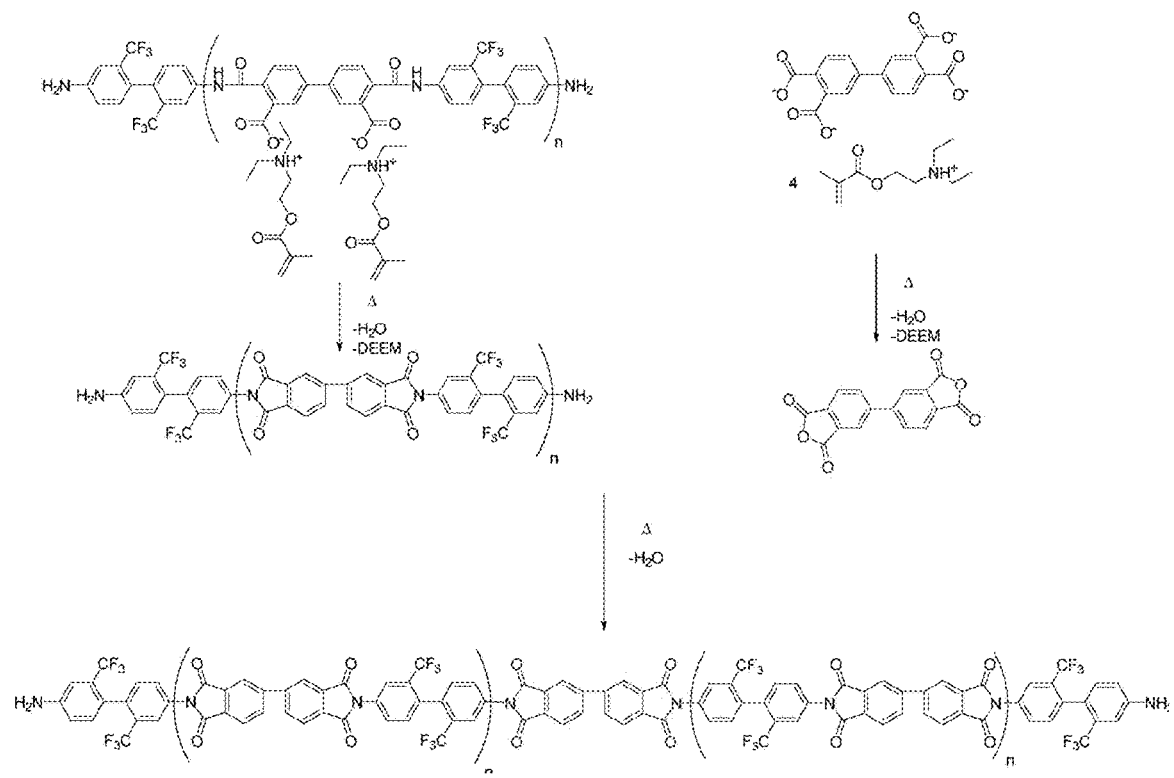
FIG. 2 shows an exemplary reaction for forming a polymer with higher weight average molecular weight from the polyimide precursor and the latent chain extender according to some embodiments of the present disclosure.

The chain extender is selected such that it is latent at room temperature, meaning that no reaction occurs between the polyimide precursor and the chain extender unless heated to a curing temperature (e.g., 250 to 450° C.). This polymer formulation having the latent chain extender is then used during the initial device manufacturing (photolithography) steps where a low weight molecular weight polymer is desired. Once the photolithography steps are complete, the polymer formulation is cured. Upon curing of the polymer formulation, the chain extender becomes activated, meaning the dianhydride is reformed as shown in the exemplary reaction of FIG. 1. The reformed dianhydride reacts with terminal amine groups to form new imide bonds, thereby forming a higher weight average molecular weight polymer. For exemplary purposes, FIG. 2 provides an exemplary reaction for forming the polymer with higher weight average molecular weight from the polyimide precursor and the latent chain extender. The exemplary polyimide precursor is BPDA-TFMB (amic acid) salt with 2-(diethylamino)ethyl methacrylate (DEEM).

In the polyimide precursor, the mol % of the diamine compound is preferably higher than the mol % of the dianhydride. Regarding the ratio of the mol % of the dianhydride to the diamine compound, the mol % of the dianhydride to the mol % of the diamine compound is preferably in the range of 0.900 to 0.999:1.000, and more preferably in the range of 0.950 to 0.990:1.000.

In the polyimide precursor, the molar equivalent of the diamine compound and the molar equivalent of the dianhydride are measured by techniques known in the art. For example, the polyimide precursor resin can be subjected to a hydrolysis treatment in a basic aqueous solution of sodium hydroxide and potassium hydroxide in order to be decomposed into diamine compound and dianhydride. The obtained sample is analyzed by gas chromatography, liquid chromatography, or the like, and the proportions of the dianhydride and the diamine compound constituting the polyimide precursor are determined.

For some embodiments, the polymer formulation includes the latent chain extender (forming a dianhydride at a curing temperature) in a mol % such that the ratio of the mol % of the dianhydride and the latent chain extender to the mol % of the diamine compound is about 1.000:1.000.

To determine the mol % of the latent chain extender (forming a dianhydride at a curing temperature) can be predicted by the Carothers equation. That is, the diamine and the dianhydride monomer are generally added in approximately a 1:1 molar stoichiometry to maximize average polymer chain length. Adding the diamine and dianhydride monomer m other ratios can change the average chain length of the resulting polymer. In general, polymerization reactions conducted with stoichiometries outside of essentially a 1:1 molar ratio of the monomers reduces the average polymer chain length as predicted by the Carothers equation and verified extensively in practice. The Carothers equation is provided below.

$$M_n = M_o X_n \quad X_n = \frac{1+r}{1-r}$$

$M_n$ = number average molecular weight $M_0$ = molecular weight of the repeat unit $X_n$ = number average degree of polymerization $r$ = stoichiometric ratio of monomers ($r \leq 1$)

According to some embodiments of the present disclosure, in the polyimide precursor, the mol % of the diamine compound is preferably higher than the mol % of the dianhydride as discussed above. Through the Carothers equation, the mol % of the latent chain extender (forming a dianhydride at a curing temperature) can be predicted such that the diamine and the dianhydride monomer are generally added in approximately a 1:1 molar stoichiometry. In other words, the ratio of the mol % of the dianhydride and the latent chain extender to the mol % of the diamine compound is about 1.000:1.000.

For some embodiments, the polymer formulation includes the latent chain extender in an amount from 0.1 mol % to 10.0 mol % such that the ratio of the mol % of the dianhydride and the latent chain extender to the mol % of the diamine compound is about 1.000:1.000. For some embodiments, the polymer formulation includes the latent chain extender in an amount from 0.5 mol % to 5.0 mol % or 1.0 mol % to 3.0 mol % such that the ratio of the mol % of the dianhydride and the latent chain extender to the mol % of the diamine compound is about 1.000:1.000.

For some embodiments, the crosslinking agent for forming the poly(amic acid) salt, i.e., polyimide precursor, can be contained in the polymer formulation from about 0.1 to 10.0 moles per mole dianhydride. For some embodiments, the crosslinking agent from about 0.5 to 7.5 moles, 1.0 to 5.0 moles, or 1.0 to 3.0 moles per mole dianhydride.

For some embodiments, the polymer formulation optionally includes other additives, such as a photoinitiator, a sensitizer, a dissolution accelerator, and an adhesion promoter. The photoinitiator can be a suitable photoinitiator known in the art. For some embodiments, the photoinitiator generates radicals upon UV exposure. Preferably, a photoinitiator absorbance peak is located where a PI precursor absorbance is minimal. For example, suitable photoinitiators for the polymer formulation include, but not limited to, 1-[9-ethyl-6-(2-methylbenzyl)-9H-carbazol-3-yl]ethanone-1-(O-acetyloxime) (OXE-02) and 1,2-octanedione 1-[4-(phenylthio)phenyl]2-(O-benzoyloxime) (OXE-01), various phosphine oxides, such as diphenyl(2,4,6-trimethylbenzoyl) phosphine oxide and phenylbis(2,4,6-trimethylbenzoyl) phosphine oxide, various acetophenone based initiators including 2-benzyl-2-(dimethylamino)-4'-morpholinobutyrophenone, 2,2-dimethoxy-2-phenylacetophenone, 2-hydroxy-2-methylpropiophenone, and 2-methyl-4'-(methylthio)-2-morpholinopropiophenone, various benzoin based initiators including benzoin, benzoin methyl ether, benzoin ethyl ether, 4,4'-dimethoxybenzoin, 4,4'-dimethylbenzil, benzophenone based initiators including benzophenone, 4,4'-bis(dimethylamino)benzophenone (Michler's ketone), 4,4'-bis(diethylamino)benzophenone (Michler's ethyl ketone), 4-(dimethylamino)benzophenone, 4-(diethylamino) benzophenone, 4,4'-dihydroxybenzophenone, and various hydroxybenzophenones and alkylbenzophenones, thioxanthones including thioxathen-9-one, isopropyl thioxanthen-9-ones, diethyl thioxanthen-9-ones and chloro thioxanthene-9-ones. Preferably, the photoinitiator is OXE-01, OXE-02, diphenyl(2,4,6-trimethylbenzoyl)phosphine oxide, phenylbis(2,4,6-trimethylbenzoyl)phosphine oxide, 4,4'-bis(dimethylamino)benzophenone, and 4,4'-bis(diethylamino)benzophenone. Most preferably, the photoinitiator is OXE-02.

For some embodiments, the photoinitiator can be contained in the polymer formulation from about 0.1 to 10.0 parts by weight per 100 parts by weight of poly(amic acid). For some embodiments, the photoinitiator can be contained in the polymer formulation in an amount from about 0.5 to 7.5 or 1.0 to 5.0 parts by weight per 100 parts by weight of poly(amic acid).

The sensitizer can be any suitable sensitizer known in the art. For some embodiments, the sensitizer is a tertiary amine containing an aromatic or (meth)acrylate group to stabilize a radical ion formed in the photoreaction. As there is already an abundance of a tertiary amine (meth)acrylate in the formulation, the addition of sensitizer in the formulation is likely not needed or optional. Suitable sensitizers for the polymer formulation include, but not limited to, N-Phenyl diethanolamine (NPDEA), N-phenyl glycine, Michler's ketone, Michler's ethyl ketone, and various alkyl 4-(dimethylamino)benzoates. For some embodiments, the crosslinkers described above can also be considered sensitizers for the polymer formulation.

For some embodiments, the sensitizer can be contained in the polymer formulation from about 0.1 to 10.0 parts by weight per 100 parts by weight of poly(amic acid). For some embodiments, the sensitizer can be contained in the polymer formulation in an amount from about 0.5 to 7.5 or 1.0 to 5.0 parts by weight per 100 parts by weight of poly(amic acid).

The dissolution accelerator can be any suitable dissolution accelerator known in the art. For some embodiments, the dissolution accelerator is a small molecule that has sufficiently low volatility to remain in a cast film during a post apply bake. For example, suitable dissolution accelerators for the polymer formulation include, but not limited to, triethylene glycol dimethacrylate (TEGMA), benzotriazole (BTA), and trimethylolpropane trimethacrylate (PTMA). Other examples include, but are not limited to, tetraethylene glycol dimethacrylate, triethylene glycol triacrylate, tetraethylene glycol dimethacrylate, various tri- and tetra-(meth) acrylate esters of pentaeryritol, 2-nitrobenzaldehyde and 3-nitrobenzaldehyde, dihydropyridine derivatives, and aromatic sulfonamides.

For some embodiments, the dissolution accelerator can be contained in the polymer formulation from about 0.1 to 20.0 parts by weight per 100 parts by weight of poly(amic acid). For some embodiments, the dissolution accelerator can be contained in the polymer formulation in an amount from about 0.5 to 15.0 or 1.0 to 10.0 parts by weight per 100 parts by weight of poly(amic acid).

The adhesion promoter can be any suitable adhesion promoter known in the art. For some embodiments, the adhesion promoter is alkoxysilane based with primary amine functionality. For some embodiments, the adhesion promoter is a silicon-containing diamine as it will incorporate throughout the PI backbone and will not interfere with the chain extension mechanism. Examples of monofunctional amine adhesion promoters include 4-aminobutyltriethoxysilane, 4-amino-3,3'-dimethylbutyltrimethoxysilane, 3-(m-aminophenoxy)propyltrimethoxysilane, m-aminophenyltrimethoxysilane, p-aminophenyltrimethoxysilane, 3-aminopropyltrimethoxysilane, 11-aminoundecyltriethoxysilane, 3-aminopropylmethyldiethoxysilane. Exemplary silicon-containing diamines include 1,3-bis(3-aminopropyl) tetramethyldisiloxane and its isomers (2-aminopropyl groups are a common impurity), as well as aminopropyl terminated oligomers of polydimethylsiloxane. Most preferably, the adhesion promoter is isomerically pure 1,3-bis (3-aminopropyl)tetramethydisiloxane due to thermal stability.

For some embodiments, the adhesion promoter can be contained in the polymer formulation from about 0.1 to 5.0 parts by weight per 100 parts by weight of poly(amic acid). For some embodiments, the adhesion promoter can be contained in the polymer formulation in an amount from about 0.1 to 3.0 or 0.1 to 1.0 parts by weight per 100 parts by weight of poly(amic acid).

A method for of controlling molecular weight of a photosensitive polyimide formulation before and after curing is also provided. The method includes providing an initial polymer formulation as discussed above. The polymer formulation includes the polyimide precursor and the latent chain extender as discussed above where a low molecular weight polymer is needed during the initial device manufacturing (photolithography) steps. The poly(amic acid), i.e., the polymer of a dianhydride and a diamine, which is part of the polyimide precursor, has relatively low weight average molecular weight. By way of example and without limitation, low weight average molecular weight polymers according to the present disclosure are generally considered to have a weight average molecular weight in the range of about 40,000 and less, typically about 25,000-35,000.

To control the weight average molecular weight of the poly(amic acid) of the polyimide precursor, the mol % of the diamine compound is controlled such that it is higher than the mol % of the dianhydride in the initial polymer formulation. Through the Carothers equation, the mol % of the latent chain extender (forming a dianhydride at a curing temperature) is controlled such that the diamine and the dianhydride monomer are generally added in approximately a 1:1 molar stoichiometry. In other words, the ratio of the mol % of the dianhydride and the latent chain extender to the mol % of the diamine compound is about 1.000:1.000.

Once the photolithography steps are complete, the polymer formulation is cured. Upon curing of the polymer formulation, the chain extender becomes activated. The chain extender reforms a dianhydride that reacts with terminal amine groups to form imide bonds to form a higher molecular weight polymer than the poly(amic acid) of the polyimide precursor.

In addition, a method for making a device using the polymer formulation described above is provided. The method for making the device includes, coating, exposing, developing, curing, etching, and mechanical forming. For some embodiments, coating includes applying a polyimide coating on a substrate. For some embodiments, the polyimide coating is the polymer formulation discussed in detail above. Preferably, the substrate is a stainless steel substrate; however, other suitable substrates known in the art are also appropriate. The polyimide coating can be applied using techniques including, but not limited to, liquid slot die, roller coat, spray, curtain coat, dry film lamination, and screen-printing techniques. For some embodiments, the polyimide coating is applied by liquid slot die and then, exposed to UV light, developed with an appropriate solvent known in the art, and cured.

Curing of the polyimide coating, e.g., the polymer formulation discussed above, to form a polyimide insulating layer on the substrate can be performed by any suitable techniques known in the art, such as infrared curing. As shown in the exemplary reaction provided in FIG. 2, during the cure step, DEEM and water are given off and the chain extender reverts back to dianhydride. The reformed dianhydride reacts with terminal amine groups of the poly(amic acid) to form imide bonds, which increases the molecular weight of the polyimide polymer. Thus, the resultant polyimide exhibits relatively high molecular weight and improved elongation and formability properties necessary for subsequent forming steps.

For some embodiments, the method for making the device further includes applying a resist coating on the substrate. The resist coating is applied on the base material using techniques including, but not limited to, liquid slot die, roller coat, spray, curtain coat, dry film lamination, and screen-printing techniques. The resist coating is then exposed to UV light, developed, etched (that is, the substrate is etched in regions not protected by the resist pattern), and stripped using photolithography and etching techniques including those known in the art. For some embodiments, the method includes mechanical forming of the devices. According to some embodiments, parts were formed with a 100 μm radius to test the formability of the parts.

EXAMPLES

The following is an exemplary procedure for preparing the polymer formulation of the present disclosure. In a 300 mL reactor purged with nitrogen, NMP (100 mL) was added. TFMB (28.80 g) was measured out in a beaker then added to the reactor with vigorous stirring. Additional NMP (40 mL) was added to the beaker to dissolve any TFMB adhered to the beaker, and this was then added to the reactor. After complete dissolution of the TFMB, BPDA (25.20 g) was slowly added to the reactor, along with additional NMP (40 mL) to ensure quantitative transfer of BPDA. The reactor temperature was set to 70° C. and the solution was stirred for 4 hours.

In a separate flask under nitrogen, BPDA (1.27 g) was suspended in NMP (30 mL). DEEM (3.22 g) and water (0.156 g) were added and contents were stirred for 4 hours at room temperature until everything was dissolved. OXE-02 (1.62 g) was then added and stirred until dissolved to form the photopackage solution.

After the 300 mL reactor had returned to room temperature, DEEM (31.90 g) was added dropwise to the reactor over 30 minutes. Finally, the photopackage solution was added to the reactor, and the solution was stirred for 1 hour at room temperature before degassing under vacuum, bottling, and freezing.

The polymer formulations of Examples 1-3 having a composition as shown in Tables 1-2 is prepared by the exemplary procedure discussed above. Comparative Examples 1-13 are prepared in a similar manner, but do not include the latent chain extender in their composition. The compositions of Comparative Examples 1-13 are also shown in Tables 1-2. All of the Examples and Comparative Examples have about 18 wt % poly(amic acid) solutions in NMP solvent and about 28-29 wt % poly(amic acid) DEEM salt solutions after addition of the DEEM cross-linking agent.

TABLE 1

| Sample | BPDA (mol %) | TFMB (mol %) | Latent Chain Extender (mol %) | Crosslinking Agent (moles per mole dianhydride) | Photoinitiator (parts per 100 parts PAA) | Sensitizer (parts per 100 parts PAA) | Dissolution accelerator (parts per 100 parts PAA) | Adhesion Promoter (parts per 100 parts PAA) |
|---|---|---|---|---|---|---|---|---|
| Example 1 | 47.6 | 50 | 2.4 | 2.0 | 3 | 0 | 0 | 0 |
| Example 2 | 47.6 | 50 | 2.4 | 2.0 | 3 | 0 | 2 | 0 |
| Example 3 | 47.6 | 50 | 2.4 | 2.0 | 3 | 0 | 2 | 0 |
| Comparative example 1 | 50 | 50 | 0 | 2.0 | 3 | 0 | 5 | 0 |
| Comparative example 2 | 49.3 | 50.9 | 0 | 2.0 | 3 | 0 | 5 | 0 |
| Comparative example 3 | 49.0 | 51.0 | 0 | 2.0 | 3 | 0 | 5 | 0 |
| Comparative example 4 | 48.8 | 51.2 | 0 | 2.0 | 3 | 0 | 10 | 0 |
| Comparative example 5 | 48.8 | 51.2 | 0 | 2.0 | 3 | 3 | 10 | 0 |
| Comparative example 6 | 48.8 | 51.2 | 0 | 2.0 | 3 | 3 | 10 | 0.5 |
| Comparative example 7 | 48.8 | 51.2 | 0 | 2.0 | 3 | 0 | 10 | 0 |
| Comparative example 8 | 48.8 | 51.2 | 0 | 2.0 | 3 | 0 | 10 | 0 |
| Comparative example 9 | 48.8 | 51.2 | 0 | 2.34 | 3 | 0 | 0 | 0 |
| Comparative example 10 | 48.8 | 51.2 | 0 | 2.0 | 3 | 0 | 5 | 0 |
| Comparative example 11 | 48.8 | 51.2 | 0 | 2.0 | 3 | 0 | 10 | 0 |
| Comparative example 12 | 48.8 | 51.2 | 0 | 2.0 | 3 | 0 | 5 | 0 |
| Comparative example 13 | 48.8 | 51.2 | 0 | 2.34 | 3 | 0 | 0 | 0 |

TABLE 2

| Sample | Polymer | Crosslinking Agent | Latent Chain Extender | Photoinitiator | Sensitizer | Dissolution Accelerator | Adhesion Promoter | MW (g/mol) | % Parts with cracks |
|---|---|---|---|---|---|---|---|---|---|
| Example 1 | BPDA-TFMB | DEEM | BPDA- | OXE02 | N/A | N/A | N/A | 32.9K | 0% |
| Example 2 | BPDA-TFMB | DEEM | BPDA- | OXE02 | N/A | BTA | N/A | 26.6K | 0% |
| Example 3 | BPDA-TFMB | DEEM | BPDA- | OXE02 | N/A | BTA | N/A | 25.4K | 10% |
| Comparative Example 1 | BPDA-TFMB | DEEM | N/A | OXE02 | N/A | BTA | N/A | 59.8K | 3% |
| Comparative Example 2 | BPDA-TFMB | DEEM | N/A | OXE02 | N/A | BTA | N/A | 41.6K | 70% |
| Comparative Example 3 | BPDA-TFMB | DEEM | N/A | OXE02 | N/A | BTA | N/A | 39.0K | 58% |
| Comparative Example 4 | BPDA-TFMB | DEEM | N/A | OXE02 | N/A | TEGDMA | N/A | 36.0K | 70% |
| Comparative Example 5 | BPDA-TFMB | DEEM | N/A | OXE02 | NPDEA | TEGDMA | N/A | 35.4K | 73% |
| Comparative Example 6 | BPDA-TFMB | DEEM | N/A | OXE02 | NPDEA | TEGDMA | APTES | 32.3K | 100% |
| Comparative Example 7 | BPDA-TFMB | DEEM | N/A | OXE02 | N/A | PTMA | N/A | 32.2K | 100% |
| Comparative Example 8 | BPDA-TFMB | DEEM | N/A | OXE02 | N/A | TEGDMA | N/A | 31.6K | 100% |
| Comparative Example 9 | BPDA-TFMB | DEEM | N/A | OXE02 | N/A | N/A | N/A | 31.6K | 100% |
| Comparative Example 10 | BPDA-TFMB | DEEM | N/A | OXE02 | N/A | BTA | N/A | 31.6K | 98% |
| Comparative Example 11 | BPDA-TFMB | DEEM | N/A | OXE02 | N/A | PTMA | N/A | 31.6K | 100% |
| Comparative Example 12 | BPDA-TFMB | DEEM | N/A | OXE02 | N/A | BTA | N/A | 28.8K | 98% |
| Comparative Example 13 | BPDA-TFMB | DEEM | N/A | OXE02 | N/A | N/A | N/A | 28.6K | 100% |

The compositions of Examples 1-3 and Comparative Examples 1-13 are used to prepare devices. Devices were formed with a 100 μm radius to test the formability of the parts. Polyimide solutions were roller coated onto stainless steel panels and then placed into a conveyor oven and dried. The resulting films were no longer tacky and were typically 20-24 μm thick. The films were then exposed to UV light through a photomask, post exposure baked, and developed in a NMP based organic developing solution to form patterned features. The panels were then cured at 350° C. for 1 hour under nitrogen. Cured film thickness was 10-12 μm. The panels were then selectively etched by coating both sides of the panel with photoresist, patterning with UV light, developing in aqueous base, etching in ferric chloride, and stripping the photoresist. The flat, etched parts were then mechanically formed using a fixed mandrel and sliding wipe punch with excess clearance. This is followed by a secondary cam punch to complete the form. The inner radius of the form is approximately 100 μm.

The formed parts were then inspected by optical microscope at 20× zoom in the region of the form. 40-100 parts for each example and comparative example were inspected. Parts where the polyimide edge had some splitting at the form line or parts with complete breaks in the polyimide layer were considered to have cracks. Parts with defects outside the formed area, but with no cracks in the formed area were excluded from the test.

As shown in Table 2, the devices of Examples 1-3, which include the latent chain extender in its polymer formulation, had excellent formability. That is, the devices of Examples 1-2 did not have any cracks in its polyimide insulating layer. Example 3 demonstrated only 10% cracks in its polyimide insulating layer formed from the polymer formulation of the present disclosure.

On the other hand, devices of Comparative Examples 2-13 showed poor formability and had at least 58% cracks in their polyimide insulating layer formed from polymer formulations without the latent chain extender. Comparative Example 1 demonstrated excellent formability and only had 3% cracks. However, Comparative Example 1 has a very high weight average molecular weight of 59.8K. As discussed above, high weight average molecular weight polymers exhibit properties that negatively impact the initial manufacturing steps, and in particular the photolithography processing steps. Comparative Example 1, therefore, is not suitable for the initial processing steps prior to the cure step for forming the device.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

We claim:

1. A device comprising:
    a metal layer; and
    a polymer formed on the metal layer, the polymer including:
        a poly(amic acid) salt as a polyimide precursor; and
        a tertiary amine salt of a tetracarboxylic acid as a latent chain extender, wherein the poly(amic acid) salt includes (i) a base polymer, and (ii) a crosslinking agent, a mol % of the dianhydride to a mol % of the diamine is in the range of 0.900 to 0.999:1.000, and a ratio of a mol % of the dianhydride and the latent chain extender to a mol % of the diamine is about 1.000:1.000 in the polymer.

2. The device of claim 1, wherein the base polymer is a dianhydride and a diamine.

3. The device of claim 1, wherein the crosslinking agent comprises a tertiary amine.

4. The device of claim 2, wherein the poly(amic acid) salt provides the mol % of the dianhydride and the mol % of the diamine in the polymer.

5. The device of claim 1, wherein the metal layer comprises a copper alloy.

6. The device of claim 1, wherein the poly(amic acid) salt is a poly(amic acid) tertiary amine salt.

7. The device of claim 2, wherein the dianhydride is BPDA.

8. The device of claim 2, wherein the diamine is TFMB.

9. The device of claim 1, wherein the crosslinking agent is DEEM.

10. The device of claim 1, wherein a weight average molecular weight of the base polymer is about 25,000-35,000.

11. The device of claim 1, wherein the tertiary amine salt of a tetracarboxylic acid as the latent chain extender is prepared by reacting a dianhydride with water and a tertiary amine at room temperature.

12. The device of claim 1, wherein the latent chain extender is prepared by reacting BPDA with water and DEEM at room temperature to form the tertiary amine salt of a tetracarboxylic acid.

13. The device of claim 1, further comprising any of: a photoinitiator, a sensitizer, a dissolution accelerator, and/or an adhesion promoter.

14. A method of forming a polyimide polymer on a metal layer, comprising:
    providing a photosensitive polymer formulation onto a metal layer, the photosensitive polymer formulation comprising:
        a poly(amic acid) salt as a polyimide precursor; and
        a tertiary amine salt of a tetracarboxylic acid as a latent chain extender, wherein the poly(amic acid) salt includes (i) a base polymer, and (ii) a crosslinking agent, a mol % of the dianhydride to a mol % of the diamine is in the range of 0.900 to 0.999:1.000; and
    curing the photosensitive polymer formulation, wherein a latent chain extender is activated responsive to curing the photosensitive polymer formulation.

15. The method of claim 14, wherein curing the photosensitive polymer formulation reforms a dianhydride that reacts with terminal amine groups to form new imide bonds form a polyimide polymer.

16. The method of claim 14, wherein the base polymer is a dianhydride and a diamine, and wherein the crosslinking agent comprises a tertiary amine.

17. The method of claim 14, wherein the poly(amic acid) salt provides the mol % of the dianhydride and the mol % of the diamine in the photosensitive polymer formulation.

18. The method according to claim 17, further comprising controlling the mol % of the diamine to be higher than the mol % of the dianhydride to control a weight average molecular weight of the base polymer of the poly(amic acid) salt in the photosensitive polymer formulation.

19. The method according to claim 17, further comprising controlling a ratio of the mol % of the dianhydride and the latent chain extender to a mol % of the diamine is about 1.000:1.000.

* * * * *